(12) United States Patent
Riho et al.

(10) Patent No.: US 9,053,821 B2
(45) Date of Patent: Jun. 9, 2015

(54) SEMICONDUCTOR DEVICE PERFORMING STRESS TEST

(71) Applicant: PS4 Luxco S.a.r.l., Luxembourg (LU)

(72) Inventors: Yoshiro Riho, Tokyo (JP); Hiromasa Noda, Tokyo (JP); Kazuki Sakuma, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/243,183

(22) Filed: Apr. 2, 2014

(65) Prior Publication Data

US 2014/0211582 A1 Jul. 31, 2014

Related U.S. Application Data

(62) Division of application No. 13/302,772, filed on Nov. 22, 2011, now Pat. No. 8,737,149.

(30) Foreign Application Priority Data

Nov. 22, 2010 (JP) .................................. 2010-260491

(51) Int. Cl.
*G11C 7/00* (2006.01)
*G11C 29/00* (2006.01)
*G11C 29/06* (2006.01)
*G11C 29/12* (2006.01)
*G11C 29/28* (2006.01)
*G11C 29/02* (2006.01)
*G11C 29/50* (2006.01)
*G11C 29/26* (2006.01)

(52) U.S. Cl.
CPC ................ *G11C 29/00* (2013.01); *G11C 29/06* (2013.01); *G11C 29/12005* (2013.01); *G11C 29/28* (2013.01); *G11C 2029/1202* (2013.01); *G11C 2029/2602* (2013.01); *G11C 29/02* (2013.01); *G11C 29/50* (2013.01)

(58) Field of Classification Search
CPC ........ G11C 29/00; G11C 29/02; G11C 28/06; G11C 29/12005; G11C 29/28
USPC ................................ 365/201, 230.03, 230.06
See application file for complete search history.

(56) References Cited

U.S. PATENT DOCUMENTS

| | | | | |
|---|---|---|---|---|
| 5,519,659 A | * | 5/1996 | Tanida et al. | 365/201 |
| 5,684,748 A | * | 11/1997 | Jang | 365/201 |
| 5,757,816 A | * | 5/1998 | Al-Assadi et al. | 714/718 |
| 5,903,575 A | * | 5/1999 | Kikuda | 714/719 |
| 5,926,422 A | * | 7/1999 | Haukness | 365/201 |
| 6,118,710 A | * | 9/2000 | Tsuji | 365/200 |
| 6,233,181 B1 | * | 5/2001 | Hidaka | 365/200 |
| 6,728,149 B2 | * | 4/2004 | Akamatsu | 365/200 |

(Continued)

*Primary Examiner* — Viet Q Nguyen

(57) ABSTRACT

A semiconductor device includes a memory cell array that is divided into a plurality of memory cell mats by a plurality of sense amplifier arrays, and each of the plurality of memory cell mats includes a plurality of word lines and a test circuit for performing a test control to activate, at a time, a plurality of word lines included in each of a plurality of selected memory cell mats that are not disposed adjacent to each other in the plurality of memory cell mats. According to the present invention, the memory cell mats with the plurality of activated word lines are distributed. Therefore, as compared with many word lines activated in one memory cell mat, the load applied to a driver circuit for driving word lines and the load applied to a power supply circuit for supplying an operation voltage to the driver circuit are reduced. As a result, more word lines can be activated at the same time.

10 Claims, 7 Drawing Sheets

(56) References Cited

U.S. PATENT DOCUMENTS

| | | | |
|---|---|---|---|
| 6,741,509 B2 * | 5/2004 | Kato et al. | 365/200 |
| 7,117,407 B2 * | 10/2006 | Boldt | 714/718 |
| 7,154,808 B2 * | 12/2006 | Shim | 365/230.04 |
| 7,307,903 B2 * | 12/2007 | Shim | 365/201 |
| 7,940,587 B2 * | 5/2011 | Kubouchi et al. | 365/201 |
| 7,961,535 B2 * | 6/2011 | Lee | 365/201 |
| 7,990,788 B2 * | 8/2011 | Hong et al. | 365/201 |
| 8,374,026 B2 * | 2/2013 | Sharon et al. | 365/185.02 |

\* cited by examiner

SEMICONDUCTOR DEVICE PERFORMING STRESS TEST

This application is a divisional of U.S. patent application Ser. No. 13/302,772, filed Nov. 22, 2011, which claims the priority of Japanese Patent Application No. 2010-260491, filed Nov. 22, 2010, the contents of which prior applications are incorporated herein by reference.

BACKGROUND OF THE INVENTION

1. Field of the Invention

The present invention relates to a semiconductor device, and more particularly, to a semiconductor device capable of performing a stress test in which a plurality of word lines are activated at a time.

2. Description of Related Art

Various operation tests are performed during manufacturing stages of semiconductor devices such as a DRAM (Dynamic Random Access Memory). For example, in a wafer state, a test is performed to detect defective addresses, and after packaging, a screening test is performed to exclude chips that do not operate properly. One of such operation tests includes a stress test. The stress test mainly performed in the wafer state. In the stress test, test data are written to each memory cell, and electrical stress is given to each memory cell. Then, a determination is made as to whether the test data subsequently read have been changed or not.

In the stress test, a method for shortening a test time is known, in which the stress is given at the same time by a plurality of word lines activated at a time. For example, Japanese Patent Application Laid-Open No. 2001-143497 discloses "all word line activation test mode". The stress test can be performed in a shorter time by increasing the number of word lines activated at a time, but a driver circuit for driving the word lines and a power supply circuit for supplying an operation voltage to the driver circuit are designed for normal operation, and therefore it is difficult to activate so many word lines at a time.

SUMMARY

In one embodiment, there is provided a semiconductor device that includes: a memory cell array divided into a plurality of memory cell mats by an intervention of a plurality of sense amplifier arrays, each of the memory cell mats having a plurality of word lines; and a test circuit performing a test operation that selects ones of the plurality of word lines at one time each included in selected ones of the plurality of memory cell mats that are not disposed adjacent to each other.

In another embodiment, there is provided a semiconductor device that includes: a plurality of memory cell mats arranged in a first direction and each including a plurality of word lines extending in a second direction that is different from the first direction; a plurality of sense amplifier arrays each arranged between two memory cell mats adjacent to each other in the first direction; and an access control circuit that controls the sense amplifier arrays and the word lines, wherein the plurality of memory cell mats are classified into a plurality of units each including two or more memory cell mats arranged adjacently, when a test signal is not activated, the access control circuit selects any one of the units based on a first portion of a row address, and selects any one of the word lines included in selected one of the units based on a second portion of the row address, and when the test signal is activated, the access control circuit selects all of the units by degrading the first portion of the row address, and selects ones of the plurality of word lines included in each unit by degrading a portion of the second portion of the row address.

According to the present invention, the memory cell mats with the plurality of word lines activated are distributed. Therefore, as compared with a case where many word lines are activated within one memory cell mat, the load applied to a driver circuit for driving word lines and the load applied to a power supply circuit for supplying an operation voltage to the driver circuit are reduced. As a result, more word lines can be activated at the same time, and the stress test can be executed in a shorter time.

BRIEF DESCRIPTION OF THE DRAWINGS

The above and other features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
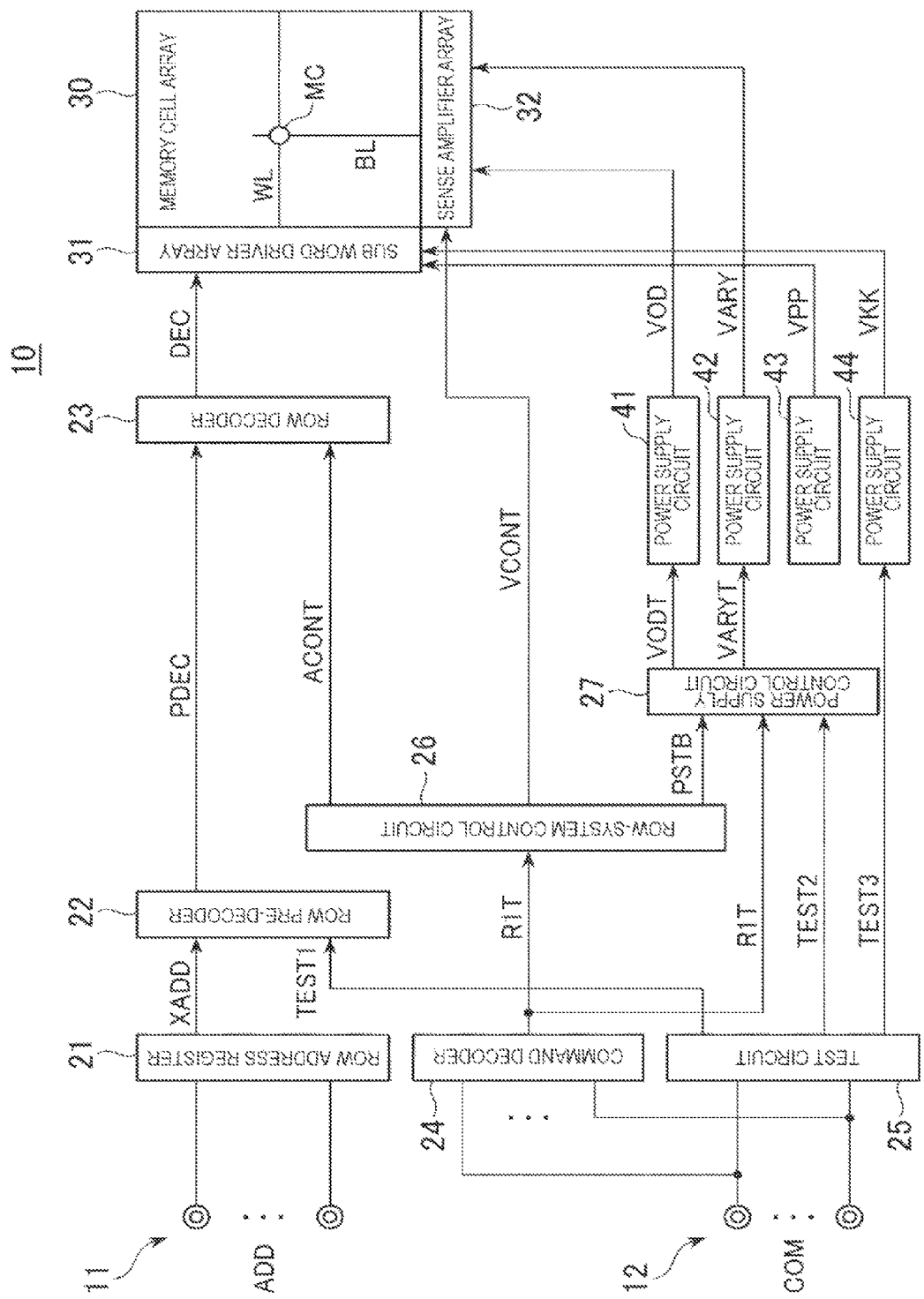
FIG. 1 is a block diagram illustrating a configuration of a semiconductor device 10 according to a preferred embodiment of the present invention.

FIG. 1 is a block diagram illustrating a configuration of a semiconductor device 10 according to a preferred embodiment of the present invention. FIG. 1 extracts and shows constituent elements concerning row access in the semiconductor device 10. Therefore, a circuit portion concerning column access is omitted in FIG. 1. This is because the present invention is characterized in that stress is applied in a short time by activating a plurality of word lines during a test, and column access does not have a direct relationship with the test when the stress is applied.

As shown in FIG. 1, the semiconductor device 10 according to the present embodiment includes an address terminal 11 and a command terminal 12 as external terminals. In addition, the semiconductor device 10 also includes a power supply terminal, a clock terminal, a data input/output terminal, and the like, but those are omitted in FIG. 1.

The address terminal 11 is supplied with an address signal ADD from the outside. A row address XADD in the address signal ADD is latched in a row address register 21. A column address is latched in a column address register not shown, but description thereabout is omitted. The row address XADD latched in the row address register 21 is supplied to a row pre-decoder 22. The row pre-decoder 22 partially decodes the row address XADD to generate a pre-decoded signal PDEC that is supplied to a row decoder 23. The row decoder 23 generates a decoded signal DEC by further decoding the pre-decoded signal PDEC. A sub word driver array 31 is controlled by the decoded signal DEC.

The command terminal 12 is supplied with a command signal COM from the outside. The command signal COM is supplied to a command decoder 24 and a test circuit 25. The command decoder 24 decodes the command signal COM to generate various kinds of internal commands based on the result of decoding. The internal commands generated by the command decoder 24 are supplied to various kinds of circuit blocks, and operations thereof are controlled. In FIG. 1, an internal active command R1T of the internal commands is shown. The internal active command R1T is generated when the command signal COM supplied from the outside indicates an active command. The internal active command R1T is supplied to a row-system control circuit 26.

In response to the internal active command R1T, the row-system control circuit 26 generates an address control signal ACONT, a sense amplifier control signal VCONT, and a power supply control signal PSTB. The address control signal ACONT is supplied to the row decoder 23 to control operation timing thereof. The sense amplifier control signal VCONT is supplied to sense amplifier array 32 to control operation timing thereof. Further, the power supply control signal PSTB is supplied to a power supply control circuit 27 to control timing of various kinds of signals generated by the power supply control circuit 27.

The power supply control circuit 27 generates power supply activation signals VODT and VARYT based on the power supply control signal PSTB and the internal active command R1T during normal operation. The power supply activation signals VODT and VARYT are supplied to the power supply circuits 41 and 42 to activate the power supply circuits 41 and 42, respectively. The power supply circuit 41 supplies an overdrive voltage VOD to the sense amplifier array 32. The power supply circuit 42 supplies an array voltage VARY to the sense amplifier array 32. The array voltage VARY is a high level voltage written to a memory cell. The overdrive voltage VOD is higher than the array voltage VARY, and is supplied to the sense amplifier array 32 to increase the speed of the sense operation at the initial sense operation.

The semiconductor device 10 further includes power supply circuits 43 and 44. The power supply circuit 43 supplies a word line activation voltage VPP to the sub word driver array 31. The power supply circuit 44 supplies a word line deactivation voltage VKK to the sub word driver array 31. The word line activation voltage VPP is supplied to a word line WL selected by the sub word driver array 31, and is generated by boosting the external voltage. On the other hand, word line deactivation voltage VKK is supplied to a word line WL that is not selected by the sub word driver array 31, and is a negative voltage less than a ground potential.

The sub word driver array 31 is connected to a plurality of word lines WL included in a memory cell array 30. The sense amplifier array 32 is connected to a plurality of bit lines BL included in the memory cell array 30. A memory cell MC is disposed at a crossing point between a word line WL and a bit line BL. When the word line WL is activated, each memory cell MC is connected to a corresponding bit line BL. The details of the memory cell array 30 will be explained later. In the present invention, the above circuits 21 to 27 controlling operation of the sub word driver array 31 and the sense amplifier array 32 may be referred to as "access control circuit".

The test circuit 25 is activated when a test command for performing the stress test is supplied from the command terminal 12. When the test command is issued, the test circuit 25 activates test signals TEST1 to TEST3. The test signals TEST1 to TEST3 are supplied to the row pre-decoder 22, the power supply control circuit 27, and the power supply circuit 44, respectively. When the test signals TEST1 to TEST3 are activated, the row pre-decoder 22, the power supply control circuit 27, and the power supply circuit 44 operate in a manner different from normal operation. The details thereof will be explained later.

Figure 2:
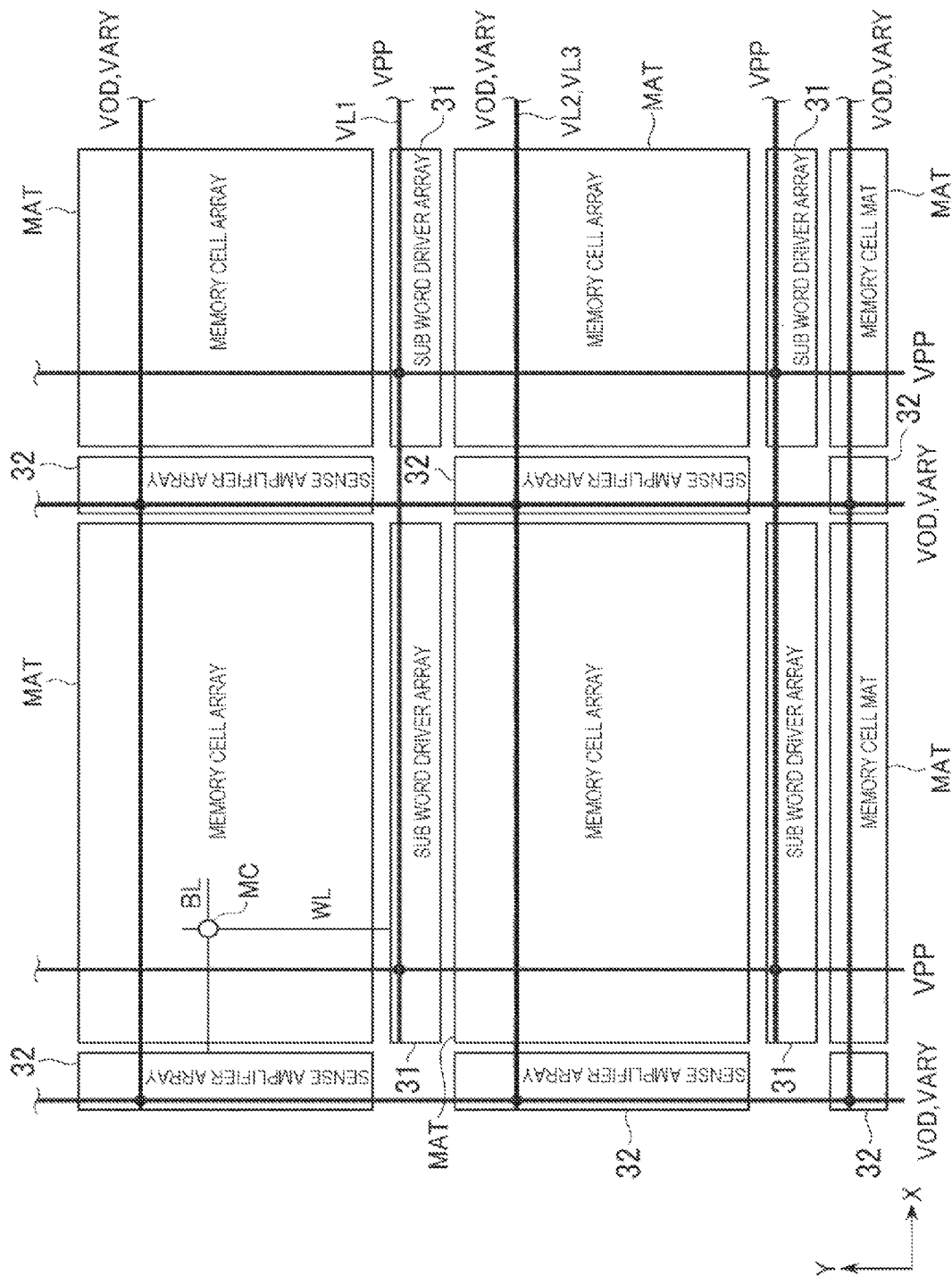
FIG. 2 is a diagram for explaining the configuration of a memory cell array 30 in more detail.

FIG. 2 is a diagram for explaining the configuration of the memory cell array 30 in more detail.

As shown in FIG. 2, in the memory cell array 30 includes a plurality of memory cell mats MAT arranged in a matrix form in an X direction and a Y direction. Each memory cell mat MAT includes a plurality of memory cells MC. The sub word driver arrays 31 are respectively disposed between the adjacent memory cell mats MAT in the Y direction. The sub word driver array 31 includes a plurality of sub word drivers, which respectively drive the corresponding word lines WL. The sense amplifier arrays 32 are respectively disposed between the adjacent memory cell mats MAT in the X direction. The sense amplifier array 32 includes a plurality of sense amplifiers, each of which amplifies a potential difference appearing between a corresponding pair of bit lines BL.

As described above, the word line activation voltage VPP is supplied to the sub word driver arrays 31 to drive the word lines WL. The power supply lines VL1 for supplying the word line activation voltage VPP are wired in a mesh form in the X direction and the Y direction, and are connected at the cross points thereof. In this configuration, the power supply lines VL1 are strengthened, and local voltage drop in the word line activation voltage VPP is prevented.

The overdrive voltage VOD and the array voltage VARY for driving the bit lines BL are supplied to the sense amplifier arrays 32. The power supply lines VL2 for supplying the overdrive voltage VOD and the power supply lines VL3 for supplying the array voltage VARY are wired in a mesh form in the X direction and the Y direction, and are connected at the cross points thereof. In this configuration, the power supply lines VL2 and VL3 are strengthened, and local voltage drop in the overdrive voltage VOD and the array voltage VARY is prevented.

Figure 3:
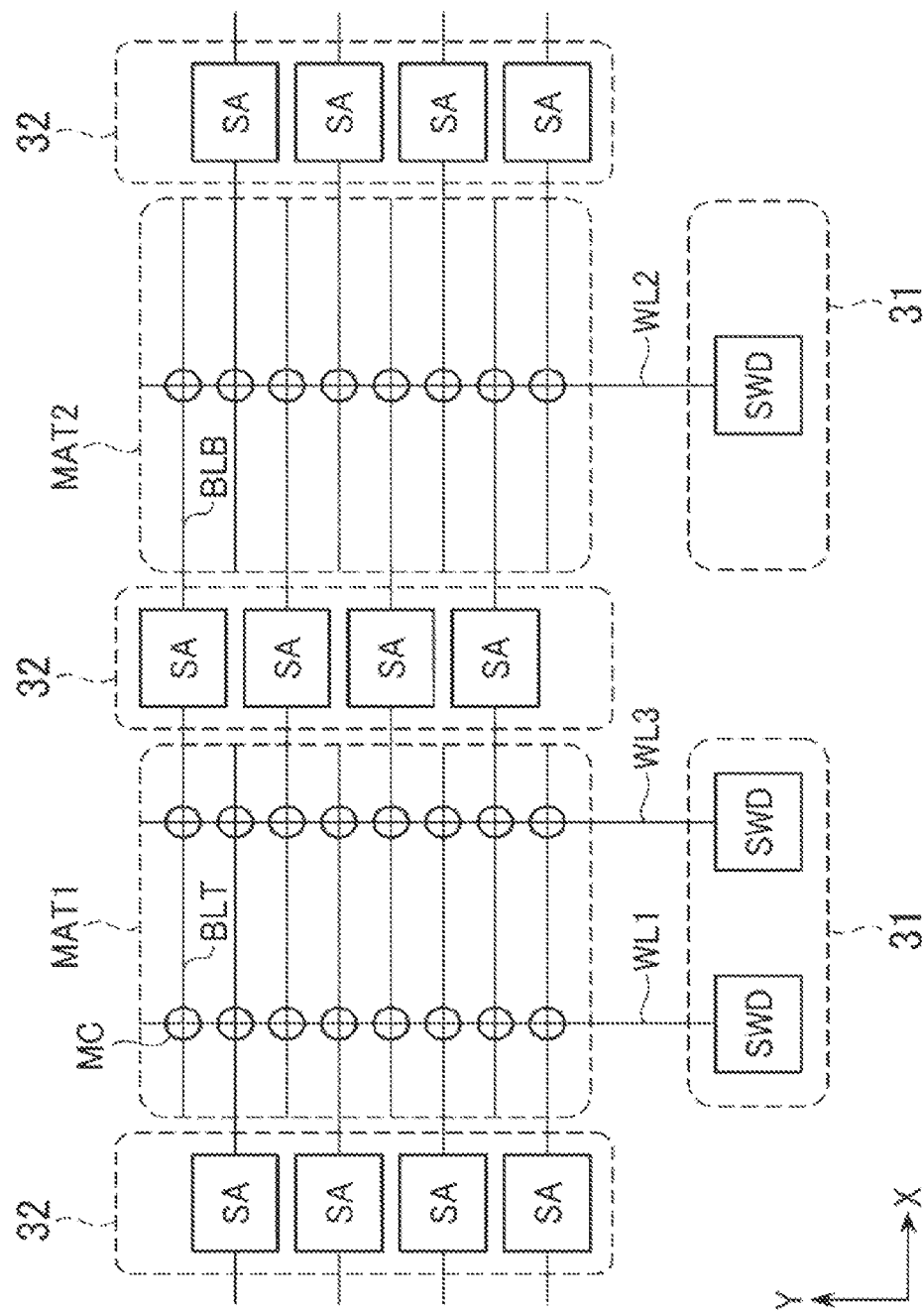
FIG. 3 is a schematic diagram for illustrating a structure of a memory cell mat MAT.

FIG. 3 is a schematic diagram for illustrating a structure of the memory cell mat MAT.

As shown in FIG. 3, the bit lines BL included in the memory cell mat MAT are alternately connected to one side and the other side of the sense amplifier arrays 32 disposed at both sides of the memory cell mat MAT in the X direction. Therefore, each sense amplifier SA included in the same sense amplifier array 32 is connected to a pair of bit lines BLT, BLB disposed in memory cell mats MAT different from each other. In other words, open-bit line type is employed. Therefore, for example, when a word line WL1 in the memory cell mat MAT1 is selected, the bit lines BLT in the memory cell mat MAT1 is an accessed side of bit lines, and the bit lines BLB in the adjacent memory cell mat MAT2 is a reference side of bit lines.

This means that the word line WL1 in the memory cell mat MAT1 and the word line WL2 in the memory cell mat MAT2 cannot be activated at a time. In contrast, when the same data are written to a plurality of memory cells for a test or when refresh operation is performed on the memory cells having the same data written thereto, it is possible to activate the plurality of word lines WL1 and WL3 in the same memory cell mat MAT1 at the same time. Naturally, this kind of access is not performed in normal operation.

Figure 4:
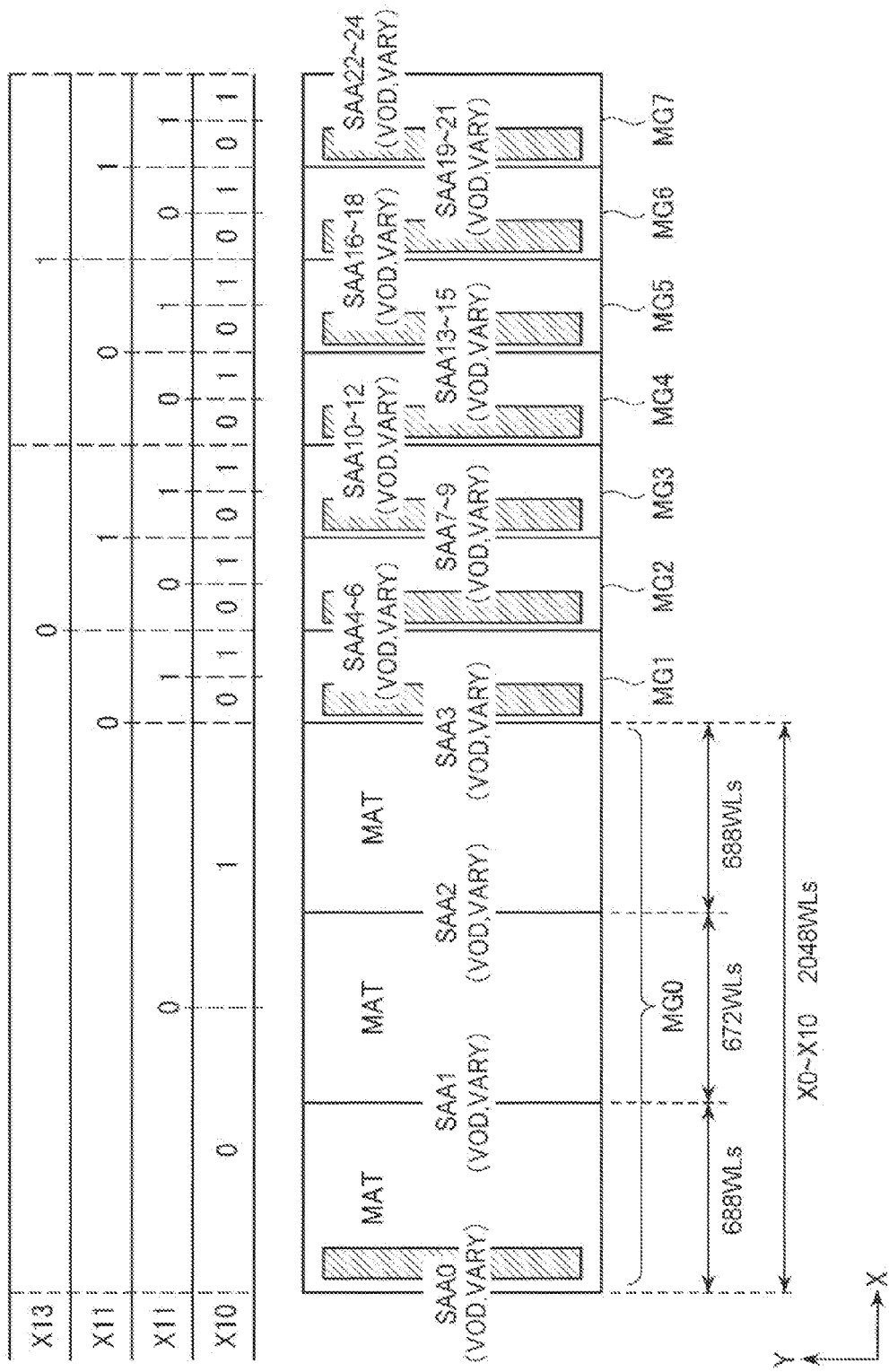
FIG. 4 is a schematic diagram for illustrating allocation of addresses in the memory cell mat MAT.

FIG. 4 is a schematic diagram for illustrating allocation of addresses in the memory cell mat MAT.

As shown in FIG. 4, a plurality of sensory cell mats MAT arranged in the X direction are selected with higher-order bits in the row address XADD. This will be explained in more detail. In the present embodiment, there are twenty-four memory cell mats MAT arranged in the X direction, which are classified into a plurality of units MG in such a manner that three memory cell mats MAT continuously disposed are adopted as one unit. One of the eight units MG is selected based on three higher-order bits X11 to X13 of the row address XADD. For example, in order to select the unit MG0 at the left end of FIG. 4, the three higher-order bits X11 to X13 of the row address XADD should be set to (0, 0, 0).

One of the word lines WL included in the selected unit MG is selected based on lower-order bits X0 to X10 of the row address XADD. Therefore, one unit MG includes 2048 (=$2^{11}$) word lines WL. These 2048 word lines are distributed among three memory cell mats MAT. In the present embodiment, 688 word lines are allocated to either end of the memory cell mat MAT in one unit MG, and 672 word lines are allocated to the central memory cell mat MAT in one unit MG. As described above, in the present embodiment, the number of word lines WL included in each memory cell mat MAT is a number that cannot be expressed as a power of two.

In the normal operation, any one of the word lines WL specified by the row address XADD is activated. Therefore, only one word line WL is activated in the twenty-four memory cell mats MAT disposed in the X direction. On the other hand, when a test command for performing a stress test is issued, operation different from the above is performed. Detailed operation when the test command for performing the stress test is issued will be hereinafter explained.

When the test command for performing the stress test is issued, the test circuit 25 activates the test signals TEST1 to TEST3. As a result, all of the row pre-decoder 22, the power supply control circuit 27, and the power supply circuit 44 supplied with the test signals TEST1 to TEST3, respectively, are entered into a test mode.

When the row pre-decoder 22 is entered into the test mode, the row pre-decoder 22 degrades the higher-order bits X11 to X13 of the address signal ADD and also degrades bits X4 to X7, which is a portion of the lower-order bits X0 to X10 of the address signal ADD. The term "degrading" means disregarding the bits in question (do not care the bits in question). Therefore, a portion to be selected by the degraded bits are all selected. More specifically, when degrading these bits X11 to X13 that indicates which unit MG is selected, all the units MG0 to MG7 are selected. The bits X4 to X7 are used to select word lines WL in the memory cell mat MAT. Therefore, when these bits X4 to X7 are degraded, 16 (=$2^4$) word lines WL in each unit MG are activated at a time.

Therefore, when the test signal TEST1 is activated, all the units MG0 to MG7 are selected, and the sixteen word lines WL in each unit are activated at the same time. In other words, totally, 128 word lines are activated at the same time. Portions indicated with shading in FIG. 4 are schematic locations of the activated word lines WL.

As described above, when the address signal ADD is supplied in the test mode, 128 times as many word lines WL as those of the normal operation are activated at the same time. Accordingly, the load of the power supply circuit 43 for supplying the activation voltage VPP to the word lines WL increases. However, because the activated word lines WL are distributed among the plurality of memory cell mats MAT and the power supply lines VL1 for supplying the word line activation voltage VPP are wired in the mesh form in the memory cell mat MAT, local voltage drop in the word line activation voltage VPP is prevented. Therefore, 128 times as many word lines WL as those of the normal operation can be activated at the same time.

In contrast, it is difficult to activate 128 word lines WL within one memory cell mat MAT at the same time. This is because, in this case, local voltage drop occurs in the word line activation voltage VPP.

In the present embodiment, the activated word lines WL are distributed among the plurality of memory cell mats MAT, which necessitates driving more sense amplifier arrays 32 than those of the normal operation. In other words, in the normal operation, it is sufficient to drive two sense amplifier arrays 32 disposed adjacent to both sides of the selected memory cell mat MAT. In the test operation, however, many memory cell mats MAT are selected at a time, and many sense amplifier arrays 32 need to be driven at the same time.

The sense amplifier arrays 32 consumes much electric power. Therefore, when voltage supplied to the sense amplifier arrays 32 drops due to many sense amplifier arrays 32 activated at a time, it takes much time to recover this to a desired level. In view of this issue, in the present embodiment, the activation period of the power supply circuits 41 and 42 are extended by the test signal TEST2 to change the operation of the power supply control circuit 27.

Figure 5:
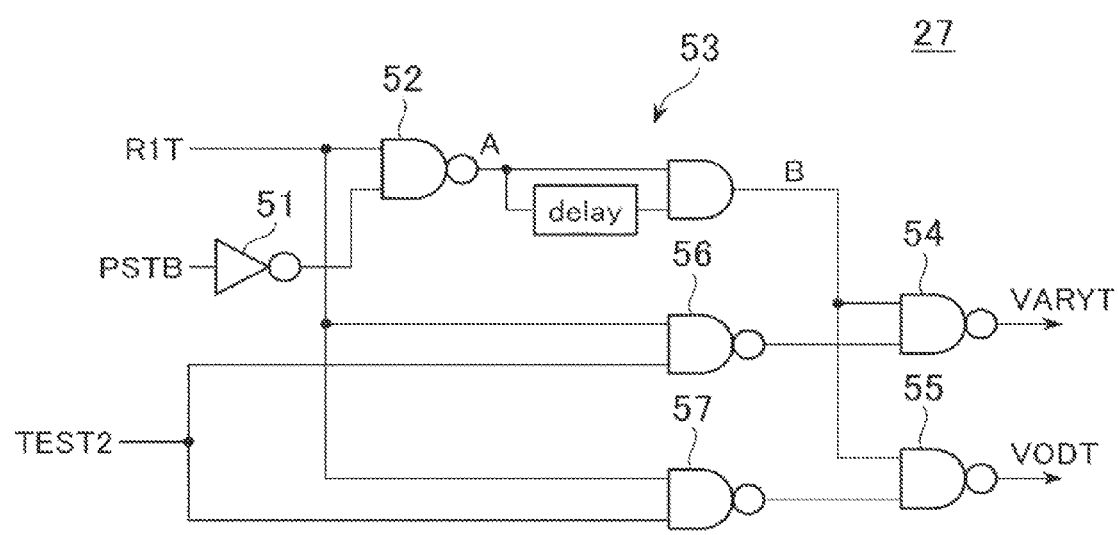
FIG. 5 is a circuit diagram of a power supply control circuit 27.
Figure 6:
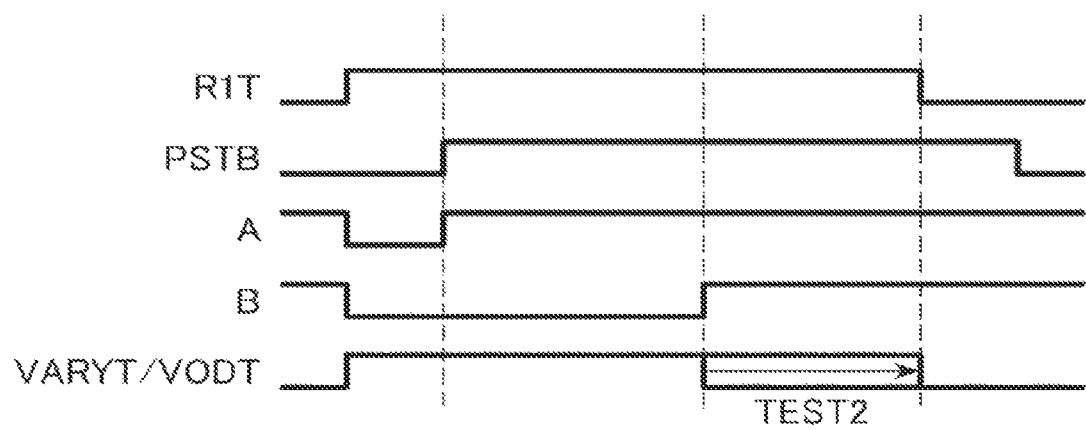
FIG. 6 is a wave form chart for explaining operation of the power supply control circuit 27.

FIG. 5 is a circuit diagram of the power supply control circuit 27. FIG. 6 is a wave form chart for explaining operation of the power supply control circuit 27.

As shown in FIG. 5, the power supply control circuit 27 includes a NAND gate circuit 52 for receiving the internal active command R1T and the power supply control signal PSTB inverted by the inverter 51 and a pulse width control circuit 53 for extending a pulse width of a signal A, which is output signal of the NAND gate circuit 52. A signal B, which is output signal of the pulse width control circuit 53, is output as power supply activation signals VODT and VARYT via NAND gate circuits 54 and 55, respectively. In the normal operation, since the low-level test signal TEST2 fixes the output signals of the NAND gate circuits 56 and 57 at a high level, the inverted signal of the signal B is output as the power supply activation signals VODT and VARYT.

In contrast, in the case where the test signal TEST2 is activated at a high level, even when the signal B changes to the high level, the power supply activation signals VODT and VARYT are maintained at the high level until the internal active command R1T returns back to the low level. Therefore, as shown in FIG. 6, the activation period of the power supply activation signals VODT and VARYT is extended.

Figure 7A:
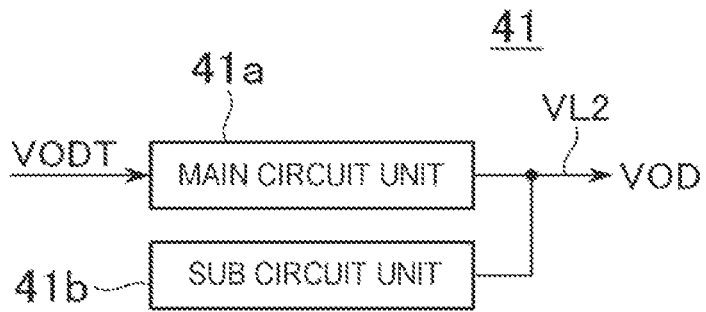
FIGS. 7A to 7C are block diagrams illustrating configurations of the power supply circuits 41, 42, and 44, respectively.
Figure 7B:
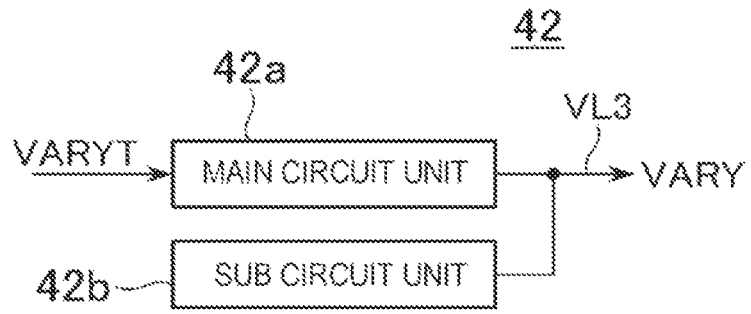
Figure 7C:
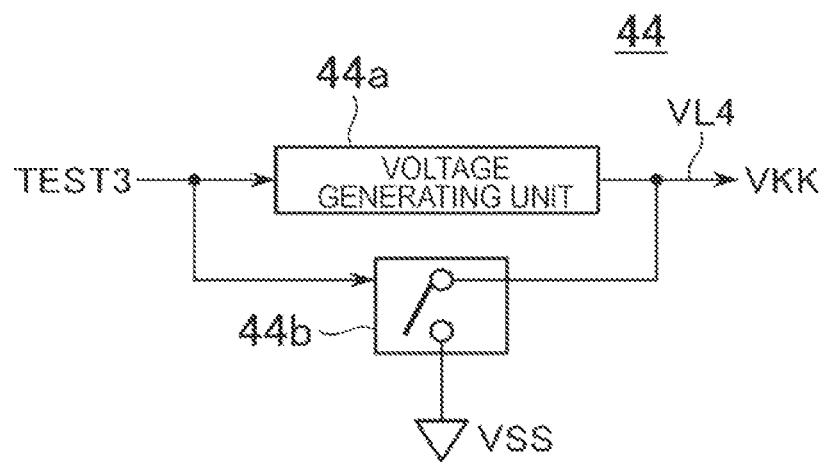

FIGS. 7A to 7C are block diagrams illustrating configurations of the power supply circuits 41, 42, and 44.

As shown in FIG. 7A, the power supply circuit 41 includes a main circuit unit 41a and a sub circuit unit 41b, whose output nodes are commonly connected to the power supply line VL2. The power supply line VL2 is a wiring for supplying the overdrive voltage VOD to the sense amplifier array 32. The main circuit unit 41a generates the overdrive voltage VOD in response to the power supply activation signal VODT. The voltage supply capacity of the main circuit unit 41a is designed to be relatively high. On the other hand, the sub circuit unit 41b generates the overdrive voltage VOD at all times. The voltage supply capacity of the sub circuit unit 41b is designed to be relatively low. In this circuit configuration, in the period in which the sense amplifier array 32 is activated, the overdrive voltage VOD is supplied having sufficient voltage supply capacity by the main circuit unit 41a and the sub circuit unit 41b while in the period in which the sense amplifier array 32 is not activated, since the level of the power supply line VL2 is maintained at a desired level by the sub circuit unit 41b. As described above, in the test mode, since the activation period of the power supply activation signals VODT is extended, the temporary drop of the overdrive voltage VOD due to many sense amplifier arrays 32 activated at the same time can be recovered until a subsequent access.

The power supply circuit 42 is the same as the above. In other words, as shown in FIG. 7B, the power supply circuit 42 includes a main circuit unit 42a and sub circuit unit 42b, whose output nodes are commonly connected to the power supply line VL3. The power supply line VL3 is a wiring for supplying the array voltage VARY to the sense amplifier array 32. The main circuit unit 42a generates the array voltage VARY in response to the power supply activation signals VARYT. The voltage supply capacity of the main circuit unit 42a is designed to be relatively high. On the other hand, the sub circuit unit 42b usually generates the array voltage VARY. The voltage supply capacity of the sub circuit unit 42b is designed to be relatively low. In this circuit configuration, in the period in which the sense amplifier array 32 is activated, the array voltage VARY is supplied with sufficient voltage supply performance with the main circuit unit 42a and the sub circuit unit 42b while in the period in which the sense amplifier array 32 is not activated, the level of the power supply line VL3 is maintained at a desired level by the sub circuit unit 42b. As described above, in the test mode, because the activation period of the power supply activation signals VARYT is extended, the temporary drop of the array voltage VARY due to many sense amplifier arrays 32 activated at the same time can be recovered until a subsequent access.

The power supply circuit 44 includes a voltage generating unit 44a and a switch circuit 44b. The voltage generating unit 44a generates the word line deactivation voltage VKK at all times in the normal operation. The output node of the voltage generating unit 44a is connected to the power supply line VL4. Then, when the test signal TEST3 is activated in the test operation, operation of the voltage generation unit 44a is stopped, and the power supply line VL4 is short-circuited to the ground level VSS by the switch circuit 44b. Since the ground level is a voltage level supplied from the outside, the voltage supply capacity is extremely high. Therefore, the level of the unselected word lines WL are fixed at the ground level VSS in the test operation, and this can prevent a phenomenon that the level of the unselected word lines WL is raised to a level more than the ground level VSS due to the increase of the load.

As described above, according to the present embodiment, a drop of the levels of various kinds of internal voltages can be prevented, thereby many word lines can be activated at the same time in the stress test. Therefore, it takes a shorter time to perform the test.

In the present embodiment, as explained with reference to FIG. 4, it is important that all the units MG including the three memory cell mats MAT are selected by degrading the higher-order bits X11 to X13 of the row address XADD. For example, it is possible to degrade not only the bits X11 to X13 but also the bit a X10. In this case, however, memory cell mats MAT disposed adjacent to each other for each input address signal ADD are selected at the same time. In this case, because the pair of bit lines BLT and BLB are disposed in the memory cell mats MAT adjacent to each other with the sense amplifier interposed therebetween as described above, the pair of bit lines receive data from the memory cell at the same time, which does not make sense as a test. For example, the stress test is assumed to be performed as follows. Data of H (or L, i.e., any one of H and L) are written to all the memory cells, and the data are read out. If the read data include L, this is determined to be defective. When the above control is performed in this test, both of BLT and BLB attain H, which causes the sense amplifier not to properly operate. Consequently, when this kind of degradation is performed, it is necessary to separately activate the word lines WL in the adjacent memory cell mats MAT, which takes a longer test time than the above embodiments. On the other hand, in the present embodiment, the number of word lines WL included in each memory cell mat MAT is a number that can not be expressed as a power of two. Therefore, there is a situation where parts of the plurality of (sixteen) word lines and the remaining parts of the plurality of (sixteen) word lines belong adjacent memory cell mats MAT, respectively, thereby two memory cell mats MAT disposed adjacent to each other are selected at the same time. In this case, it is necessary to separately activate the word lines WL in order to prevent the above described problem. However, the above situation is limited to a rare situation in the test in which the sixteen word lines WL belong two memory cell mats MAT. Therefore, the entire test time is hardly affected due to the situation.

Alternatively, it is possible to degrade the bits X12 and X13 without degrading the bit X11. In this case, however, it is necessary to activate thirty-two word lines WL per one memory cell mat MAT in order to activate 128 word lines WL at the same time just like the above embodiments, which reduces the effect of distributing the load as compared with the above embodiments.

In view of these issues, in the present embodiment, the bits X11 to X13 are degraded.

In the present embodiment, a very important reason why the bits X11 to X13 are degraded is that the number of word lines WL included in one memory cell mat MAT is a number that can not be expressed as a power of two. When the number of word lines WL included in one memory cell mat MAT is a number that can not be expressed as a power of two, it is very complicated to perform the control as to which bits are to be degraded to make it less likely to select adjacent memory cell mats MAT at the same time. In view of this issue, in the present embodiment, attention is paid to the units MG with which the number of word lines WL can be expressed with a power of two, and the bits X11 to X13 used for selecting these units MG are degraded. In this configuration, two adjacent memory cell mats MAT are selected at the same time only when each unit MG cross the sense amplifier arrays 32. Therefore, the control can be simplified in this configuration.

It is apparent that the present invention is not limited to the above embodiments, but may be modified and changed without departing from the scope and spirit of the invention.

What is claimed is:

1. A semiconductor device comprising:
   a memory cell array divided into a plurality of memory cell mats by an intervention of a plurality of sense amplifier arrays, each of the memory cell mats having a plurality of word lines; and
   a test circuit performing a test operation that selects ones of the plurality of word lines at one time each included in selected ones of the plurality of memory cell mats that are not disposed adjacent to each other, wherein
   each of the sense amplifier arrays includes a plurality of sense amplifiers each connected to an associated pair of bit lines,
   one of the pair of bit lines is arranged in one of two memory cell mats adjacent to each other, and
   other of the pair of bit lines is arranged in other of the two memory cell mats.

2. The semiconductor device as claimed in claim 1, wherein two or more memory cell mats that are not selected are interposed between each of the selected memory cell mats.

3. The semiconductor device as claimed in claim 2, wherein the plurality of memory cell mats are classified into a plurality of units each including three or more memory cell mats arranged adjacently, and the test circuit selects the ones of the plurality of word lines at one time included in each unit.

4. The semiconductor device as claimed in claim 3, wherein each of the unit is selected based on a first hit group that is a part of a row address, and each of the word line is selected based on a second bit group that is another part of the row address.

5. The semiconductor device as claimed in claim 4, wherein the test circuit selects all of the plurality of units by degrading the first bit group of the row address.

6. The semiconductor device as claimed in claim 5, wherein the test circuit selects the ones of the plurality of word lines by degrading a portion of the second bit group of the row address.

7. The semiconductor device as claimed in claim 1, further comprising a first power supply circuit supplying an operation voltage to the sense amplifier arrays, wherein the test circuit activates the first power supply circuit for a longer time than in a normal operation.

8. The semiconductor device as claimed in claim 1, further comprising a power supply circuit supplying an inactive voltage to the word lines that are not selected, wherein the test circuit allows the power supply circuit to output the inactive voltage having different level from a normal operation.

9. The semiconductor device as claimed in claim 8, wherein the test circuit allows the power supply circuit to output the inactive voltage having a ground level.

10. The semiconductor device as claimed in claim 1, wherein the test circuit is connected to a plurality of command terminals supplied with a command signal, when the command signals indicates a test state, the test circuit performs the test operation, and when the command signal indicates a normal operation state, the test circuit performs a row address control that selects one of the word lines included in selected one of the memory cell mats.

* * * * *

UNITED STATES PATENT AND TRADEMARK OFFICE
CERTIFICATE OF CORRECTION

PATENT NO. : 9,053,821 B2  
APPLICATION NO. : 14/243183  
DATED : June 9, 2015  
INVENTOR(S) : Yoshiro Riho, Hiromasa Noda and Kazuki Sakuma Page 1 of 1

It is certified that error appears in the above-identified patent and that said Letters Patent is hereby corrected as shown below:

Claims

Col. 9, line 8, Claim 3, which should read "each of the unit is selected based on a first bit group that is"

Signed and Sealed this
Twenty-ninth Day of September, 2015

Michelle K. Lee
*Director of the United States Patent and Trademark Office*